(12) United States Patent
Hong et al.

(10) Patent No.: US 11,604,421 B1
(45) Date of Patent: Mar. 14, 2023

(54) OVERLAY MARK, OVERLAY MEASUREMENT METHOD AND SEMICONDUCTOR DEVICE MANUFACTURING METHOD USING THE OVERLAY MARK

(71) Applicant: AUROS TECHNOLOGY, INC., Hwaseong-si (KR)

(72) Inventors: Sung Hoon Hong, Incheon (KR); Hyun Jin Chang, Seoul (KR); Hyun Chui Lee, Hwaseong-si (KR); Jack Woo, Seoul (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 17/873,727

(22) Filed: Jul. 26, 2022

(30) Foreign Application Priority Data

Aug. 17, 2021 (KR) .......................... 10-2021-0108200

(51) Int. Cl.
*H01L 21/027* (2006.01)
*G03F 7/20* (2006.01)

(52) U.S. Cl.
CPC ................................ *G03F 7/70633* (2013.01)

(58) Field of Classification Search
CPC ........................... G03F 7/70633; H01L 21/027
USPC ................................ 438/401; 430/5, 7, 2, 22
See application file for complete search history.

(56) References Cited

U.S. PATENT DOCUMENTS

| 2008/0034344 A1* | 2/2008 | Chiu | G03F 7/70633 430/5 |
| 2013/0107259 A1* | 5/2013 | Choi | G03F 7/70633 257/E23.179 |
| 2017/0357154 A1* | 12/2017 | Oh | G01B 11/005 |

FOREIGN PATENT DOCUMENTS

| JP | 4333213 B2 | 9/2009 |
| JP | 5180419 B2 | 4/2013 |
| JP | 2020112807 A | 7/2020 |
| KR | 1020140096331 A | 8/2014 |
| KR | 1020150111451 A | 10/2015 |
| KR | 101665569 B1 | 10/2016 |
| KR | 1020170141312 A | 12/2017 |
| KR | 101906098 B1 | 10/2018 |

\* cited by examiner

*Primary Examiner* — Caleen O Sullivan
(74) *Attorney, Agent, or Firm* — Novick, Kim & Lee PLLC; Jae Youn Kim

(57) ABSTRACT

Provided are an overlay mark, and an overlay measurement method and a semiconductor device manufacturing method using the overlay mark. Specifically, provided is an overlay mark for determining relative misalignment between two or more pattern layers or between two or more patterns separately formed in one pattern layer, the overlay mark including a first overlay mark positioned in the center, a second overlay mark positioned above and below the first overlay mark or on the left and right thereof, and a third overlay mark and a fourth overlay mark each positioned in a diagonal line with the first overlay mark in between.

11 Claims, 7 Drawing Sheets

OVERLAY MARK, OVERLAY MEASUREMENT METHOD AND SEMICONDUCTOR DEVICE MANUFACTURING METHOD USING THE OVERLAY MARK

CROSS REFERENCE TO RELATED APPLICATION

The present application claims priority to Korean Patent Application No. 10-2021-0108200, filed Aug. 17, 2021, the entire contents of which is incorporated herein for all purposes by this reference.

BACKGROUND OF THE INVENTION

Field of the Invention

The present disclosure relates to an overlay mark, and an overlay measurement method and a semiconductor device manufacturing method using the overlay mark.

Description of the Related Art

A plurality of pattern layers are sequentially formed on a semiconductor substrate. In addition, a circuit of one layer may be formed in two patterns through double patterning. Such pattern layers or a plurality of patterns of one layer need to be formed accurately at preset positions so as to manufacture a desired semiconductor device.

Therefore, to check whether pattern layers are accurately aligned, overlay marks formed simultaneously with the pattern layers are used.

A method of measuring overlay by using an overlay mark is as follows. First, in a pattern layer formed in the previous process, for example, an etching process, one structure that is a part of the overlay mark is formed simultaneously with the formation of the pattern layer. Then, in the subsequent process, for example, a photolithography process, the remaining structure of the overlay mark is formed on the photoresist. Next, an overlay measuring device acquires an image of the overlay structure (acquires the image with penetration through the photoresist layer) of the pattern layer formed in the previous process and an image of the overlay structure of the photoresist layer, and measures an offset value between the centers of the images to measure an overlay value. When the overlay value is out of the allowable range, the photoresist layer is removed and the above operation is repeated.

FIG. 1 is a plan view showing a conventional overlay mark. As shown in FIG. 1, the conventional overlay mark 1 includes four sets of working zones 4, 5, 6, and 7. Each of the sets of working zones 4, 5, 6, and 7 includes two working zones positioned in a diagonal line. Each of the sets of working zones 4, 5, 6, and 7 is used for overlay measurement in the direction of the X-axis or Y-axis of the pattern layer that is formed together with the corresponding set of working zones.

Each working zone includes bars that are arranged at regular intervals starting from the center of the overlay mark 1 to the outer edge of the overlay mark 1. Accordingly, using the overlay measuring device, a periodic signal may be obtained from each of the two working zones belonging to each of the sets of working zones 4, 5, 6, and 7, as shown in FIG. 2. The graph of FIG. 2 may be obtained from a selected partial area 8 shown in FIG. 1, for example.

In the graph of FIG. 2, the peaks are positioned at which the bars are arranged. Since the bars are periodically arranged in the conventional overlay mark 1, the obtained signals also have periodicity. In addition, the overlay is measured through correlation analysis of two periodic signals obtained from two selected areas 8 and 8'.

As shown in FIG. 2, the signals obtained from the conventional overlay mark 1 have periodicity. Therefore, when there is an error of one period or more between two periodic signals, it is difficult to distinguish the error of one period or more from an error less than one period through correlation analysis.

In addition, there is a problem that when the periodic signals are degraded because of a focus error and process influence, accuracy decreases in the process of correlation analysis.

In addition, in the case in which the bars are arranged at regular intervals, if the pitch is reduced, the difference (contrast) between the maximum and minimum values of a periodic signal is reduced. Therefore, it is difficult to strengthen the signal by increasing density.

In addition, since each working zone is formed over a long area from the center of the overlay mark 1 to the outer edge of the overlay mark 1, optical aberration caused by an inclined optical element, for example, a beam splitter, of the overlay measuring device may have a great influence. In particular, the working zones for measuring overlay in a particular direction with a large change in distance from the optical system in the direction in which the bars are arranged, are significantly affected by optical aberration because there is a great difference between the optical path to the bars close to the center of the overlay mark 1 and the optical path to the bars positioned at the outer edge.

In addition, when the overlay mark 1 is formed using a scanner-type stepper device, the deviation is small for the bars arranged in the scanning direction and the deviation is large for the bars arranged in the direction perpendicular to the scanning direction. In the conventional overlay mark 1, the working zones are arranged regardless of the scanning direction, so the deviation of the bars arranged in the direction perpendicular to the scanning direction may affect an overlay measurement step.

The foregoing is intended merely to aid in the understanding of the background of the present disclosure, and is not intended to mean that the present disclosure falls within the purview of the related art that is already known to those skilled in the art.

DOCUMENT OF RELATED ART (Patent Document 1) Japanese patent JP 5180419

SUMMARY OF THE INVENTION

The present disclosure is directed to providing an overlay mark capable of easily determining a large-scale overlay error of the interval between adjacent bars or more to easily detect an unexpected accident in a semiconductor manufacturing process.

In addition, the present disclosure is directed to providing an overlay mark capable of minimizing the influence of signal degradation due to a focus error and process influence.

In addition, the present disclosure is directed to providing an overlay mark capable of minimizing the influence of monochromatic aberrations.

In addition, the present disclosure is directed to providing an overlay mark having a small area.

In addition, the present disclosure is directed to providing an overlay measurement method and a semiconductor device manufacturing method using the overlay mark.

According to the present disclosure, there is provided an overlay mark for determining relative misalignment between two or more pattern layers or between two or more patterns separately formed in one pattern layer, the overlay mark including a first to a fourth overlay mark.

The first overlay mark is positioned in a center portion of the overlay mark, and includes a first overlay structure and a second overlay structure, wherein the first overlay structure includes a plurality of first bars arranged at intervals in a first direction, and the second overlay structure includes a plurality of second bars arranged at intervals in the first direction, and is 180-degrees rotationally symmetric to the first overlay structure.

The second overlay mark includes a third overlay structure and a fourth overlay structure, wherein the third overlay structure is offset from the first overlay structure in a second direction perpendicular to the first direction, and includes a plurality of third bars arranged at intervals in the first direction, and the fourth overlay structure includes a plurality of fourth bars arranged at intervals in the first direction, is positioned to face the third overlay structure with the first overlay mark in between, and is 180-degrees rotationally symmetric to the third overlay structure.

The third overlay mark includes a fifth overlay structure and a sixth overlay structure positioned in a first diagonal line with the first overlay mark in between, wherein the fifth overlay structure and the sixth overlay structure are 180-degrees rotationally symmetric to each other, the fifth overlay structure includes a plurality of fifth bars arranged at intervals in the second direction, and the sixth overlay structure includes a plurality of sixth bars arranged at intervals in the second direction.

The fourth overlay mark includes a seventh overlay structure and an eighth overlay structure positioned in a second diagonal line intersecting the first diagonal line with the first overlay mark in between, wherein the seventh overlay structure and the eighth overlay structure are 180-degrees rotationally symmetric to each other, the seventh overlay structure includes a plurality of seventh bars arranged at intervals in the second direction, and the eighth overlay structure includes a plurality of eighth bars arranged at intervals in the second direction.

In addition, in the overlay mark according to the present disclosure, the first overlay structure may be symmetric with respect to a center line in the second direction, and the intervals between the first bars adjacent to each other may be different from each other.

In addition, in the overlay mark, the farther the first bars are from the center line in the second direction, the narrower the intervals between the first bars adjacent to each other are.

In addition, in the overlay mark, the farther the first bars are from the center line in the second direction, the broader the intervals between the first bars adjacent to each other are.

In addition, in the overlay mark, the first bars and the second bars may be connected to each other in the second direction.

In addition, in the overlay mark, the overlay mark may be formed using a scanner-type stepper, and the second direction may be parallel to a scanning direction of the stepper.

In addition, according to the present disclosure, there is provided a method of manufacturing a semiconductor device, the method including: forming an overlay mark simultaneously with formation of a plurality of consecutive pattern layers or a plurality of patterns separately formed in one pattern layer; measuring an overlay value by using the overlay mark; and using the measured overlay value to control a process of forming a plurality of consecutive pattern layers or a plurality of patterns separately formed in one pattern layer, wherein the overlay mark is the above-described overlay mark.

In addition, in the method of manufacturing the semiconductor device, in the forming of the overlay mark, the overlay mark may be formed using the scanner-type stepper, and the second direction may be parallel to the scanning direction of the stepper.

In addition, according to the present disclosure, there is provided a method of measuring overlay between a plurality of consecutive pattern layers or a plurality of patterns separately formed in one pattern layer, the method including: obtaining an image of an overlay mark that is formed simultaneously with formation of the plurality of consecutive pattern layers or the plurality of patterns separately formed in one pattern layer; and analyzing the image of the overlay mark, wherein the overlay mark is the above-described overlay mark.

In addition, in the method of measuring the overlay, in the obtaining of the image of the overlay mark, the image of the overlay mark may be obtained using an overlay measuring device provided with an inclined optical element, and in the obtaining of the image of the overlay mark, the overlay measuring device may be positioned such that a distance between the inclined optical element and the overlay mark increases or decreases as the distance goes in the first direction, and the distance is constant as the distance goes in the second direction.

In addition, in the method of measuring the overlay, the inclined optical element may be a beam splitter.

According to the present disclosure, the overlay mark has different intervals between the bars, so when there is a large-scale overlay error of the interval between adjacent bars or more, the overlay error can be easily determined. Accordingly, an unexpected accident occurring in the semiconductor manufacturing process can be detected.

In addition, since the intervals between the bars are different from each other and there is a difference in signal density, signal degradation due to a focus error and process influence can be minimized.

In addition, the influence of monochromatic aberrations can be minimized.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
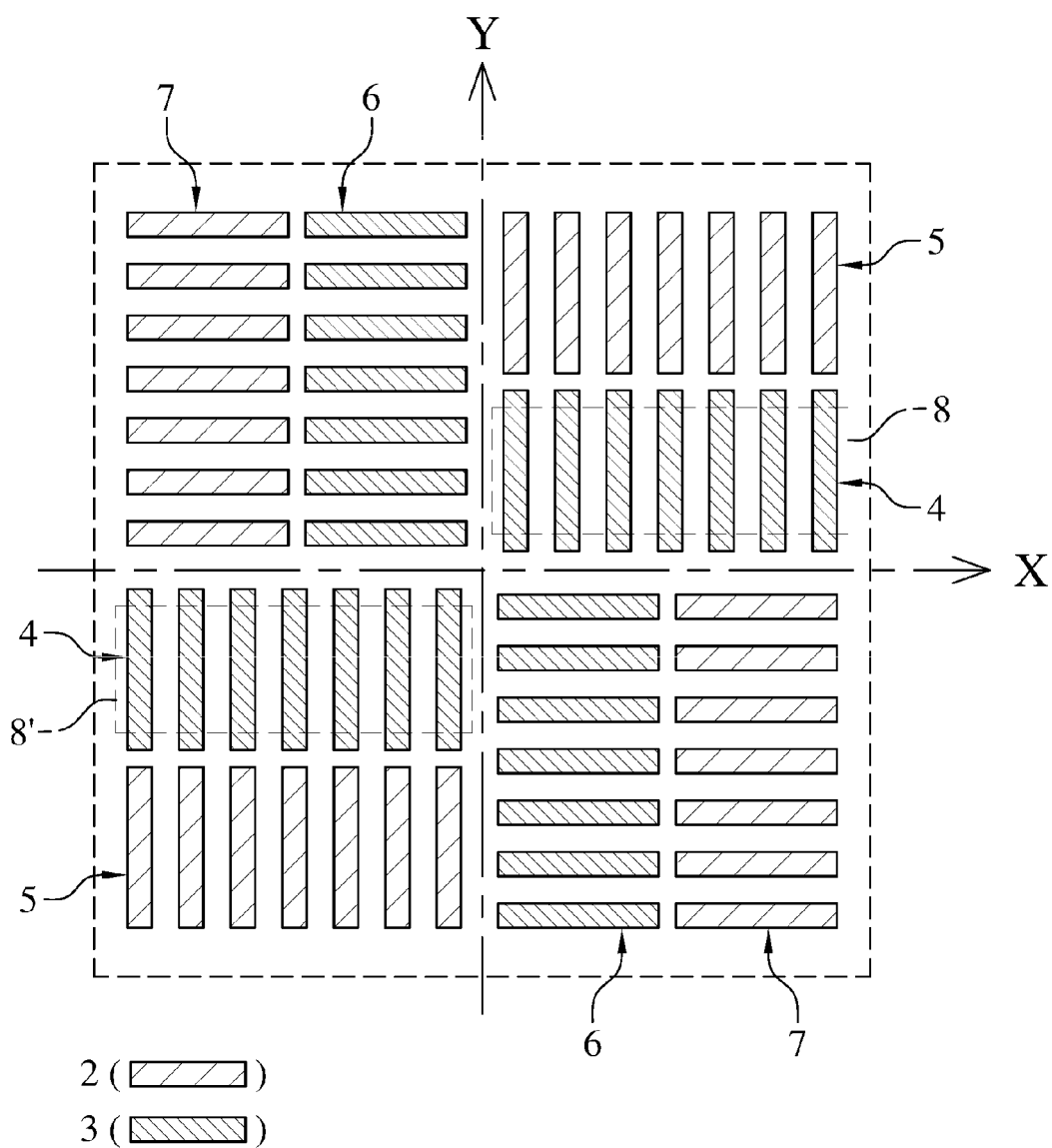
FIG. 1 is a plan view showing a conventional overlay mark.

Hereinafter, embodiments of the present disclosure will be described in detail with reference to the accompanying drawings. It should be understood that the embodiments of the present disclosure may be changed to a variety of embodiments and the scope of the present disclosure is not limited to the embodiments described hereinbelow. The embodiments of the present disclosure are provided in order to fully describe the disclosure for those of ordinary skill in the art. Therefore, shapes and sizes of the elements in the drawings may be exaggerated for a more precise description. Throughout the drawings, the elements denoted by the same reference numerals refer to the same elements.

Figure 3:
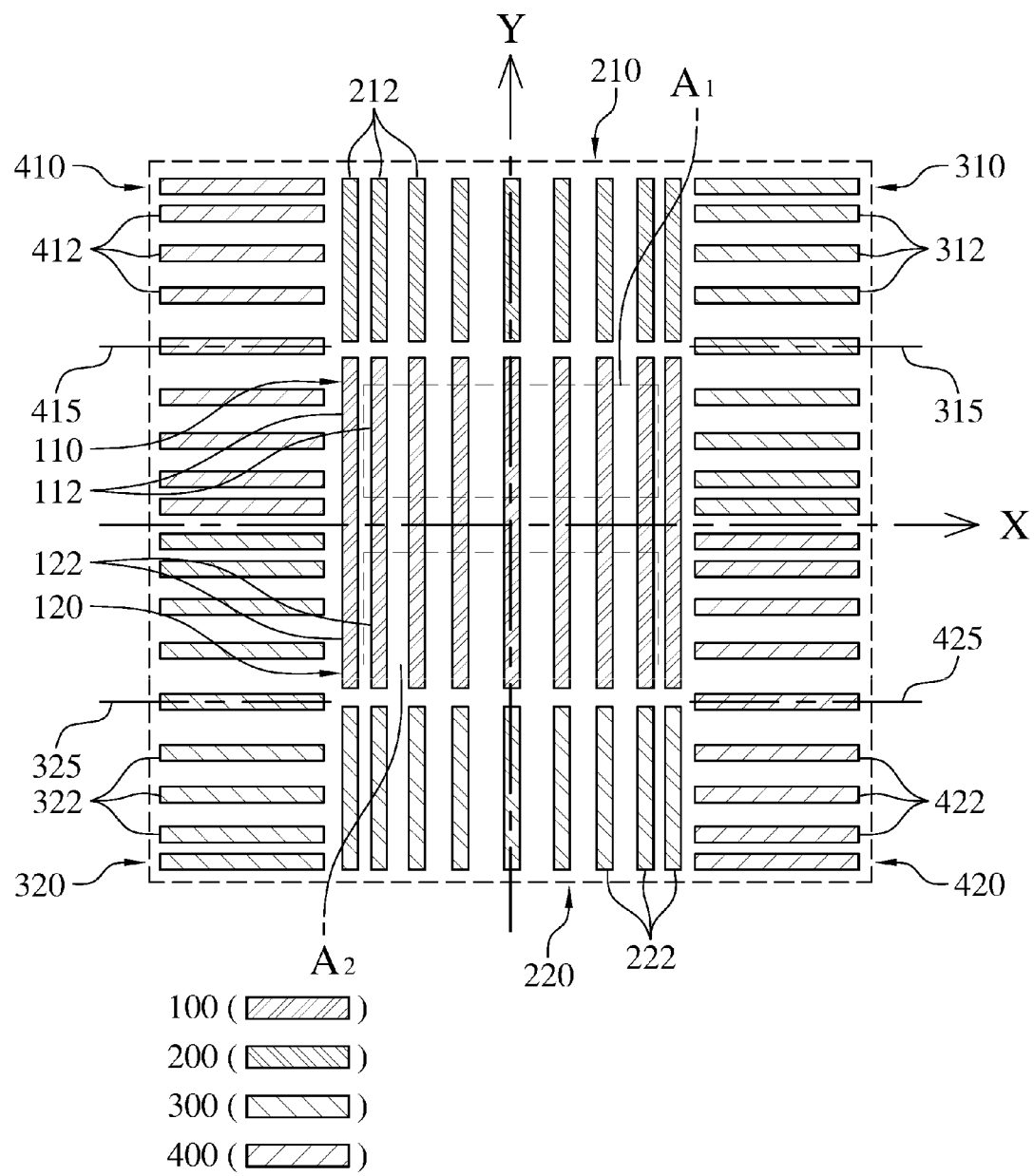
FIG. 3 is a plan view showing an example of an overlay mark according to the present disclosure.

FIG. 3 is a plan view showing an example of an overlay mark according to the present disclosure. FIG. 3 shows a state in which a first overlay mark 100, a second overlay mark 200, a third overlay mark 300, and a fourth overlay mark 400 are all aligned. In the aligned state, symmetry centers of the first to fourth overlay marks 100, 200, 300, and 400 match. When there is an overlay error, the symmetry centers of the marks, among the first to fourth overlay marks 100, 200, 300, and 400, formed together with different pattern layers do not match.

In FIG. 3, to distinguish between the first to fourth overlay marks 100, 200, 300, and 400, the marks are shown with different hatching patterns. The used hatching patters are only for easily distinguishing between the first to fourth overlay marks 100, 200, 300, and 400 and are independent of the shapes of the first to fourth overlay marks 100, 200, 300, and 400.

Referring to FIG. 3, the example of the overlay mark 10 according to the present disclosure includes the first to fourth overlay marks 100, 200, 300, and 400. The overlay mark 10 of this embodiment is formed in a scribe lane of a semiconductor wafer and is provided to measure the overlay between two or more pattern layers on the semiconductor wafer or between two or more patterns on a single layer.

In the case of the overlay mark used for measurement of the overlay between two different pattern layers, the first overlay mark 100 and the third overlay mark 300 may be formed together with a first pattern layer, and the second overlay mark 200 and the fourth overlay mark 400 may be formed together with a second pattern layer, for example. Alternatively, the first overlay mark 100 and the fourth overlay mark 400 may be formed together with the first pattern layer, and the second overlay mark 200 and the third overlay mark 300 may be formed together with the second pattern layer.

In this case, measured are an overlay value in a first direction between the first pattern layer and the second pattern layer, and an overlay value in a second direction perpendicular to the first direction. The first direction may be an X-axis direction or a Y-axis direction. In this embodiment, the first direction is the X-axis direction, and the second direction is the Y-axis direction.

In addition, in the case of the overlay mark used for measurement of the overlay between different patterns in the same layer, for example, two patterns formed in a double patterning process, the first overlay mark 100 and the third overlay mark 300 may be formed together with the first pattern, and the second overlay mark 200 and the fourth overlay mark 400 may be formed together with the second pattern. Alternatively, the first overlay mark 100 and the fourth overlay mark 400 may be formed together with the first pattern, and the second overlay mark 200 and the third overlay mark 300 may be formed together with the second pattern. In the case of the overlay mark used for measurement of the overlay between three different pattern layers, the first overlay mark 100 and the third overlay mark 300 may be formed together with the first pattern layer, and the second overlay mark 200 and the fourth overlay mark 400 may be formed together with the second pattern layer and a third pattern layer, respectively, for example. In this case, measured are an overlay value in the X-axis direction between the first pattern layer and the second pattern layer, and an overlay value in the Y-axis direction between the first pattern layer and the third pattern layer. Not measured are an overlay value in the Y-axis direction between the first pattern layer and the second pattern layer, and an overlay value in the X-axis direction between the first pattern layer and the third pattern layer.

Hereinafter, for convenience, a description will be given based on the measurement of the overlay between different two pattern layers.

As shown in FIG. 3, the first overlay mark 100 is positioned at the center portion of the overlay mark 10. The first overlay mark 100 includes a first overlay structure 110 and a second overlay structure 120. The first overlay mark 100 is 180-degrees rotationally symmetric with respect to the symmetry center of the first overlay mark 100.

In this embodiment, the first overlay structure 110 and the second overlay structure 120 are used to find the center of the first overlay mark 100 in the X-axis direction.

The first overlay structure 110 includes a plurality of first bars 112 that are formed extending in the Y-axis direction. The first bars 112 are arranged at intervals in the X-axis direction. The first overlay structure 110 is symmetric with respect to the center line (matched with the Y-axis) passing through the center of the first overlay mark 100 in the Y-axis direction. The first bars 112 are arranged such that the farther the first bars 112 are from the center line in the Y-axis direction, the narrower the intervals therebetween are.

The second overlay structure 120 includes a plurality of second bars 122 that are formed extending in the Y-axis direction. The second bars 122 are arranged at intervals in the X-axis direction. The second overlay structure 120 is symmetric with respect to the center line (matched with the Y-axis) passing through the center of the first overlay mark 100 in the Y-axis direction. The second bars 122 are arranged such that the farther the second bars 122 are from the center line in the Y-axis direction, the narrower the intervals therebetween are.

In this embodiment, the first bars 112 and the second bars 122 are connected to each other in the Y-axis direction, but the first bars 112 and the second bars 122 may be separated from each other.

It is shown that the numbers of the first bars 112 and the second bars 122 are nine each, but may be two to eight, or 10 or more.

The second overlay mark 200 includes a third overlay structure 210 and a fourth overlay structure 220. The second overlay mark 200 is 180-degrees rotationally symmetric with respect to the symmetry center of the second overlay mark 200. The third overlay structure 210 and the fourth overlay structure 220 are positioned above and below with the first overlay mark 100 in between. The second overlay mark 200 is formed in a different pattern layer from the first overlay mark 100.

In this embodiment, third overlay structure 210 and the fourth overlay structure 220 are used to find the center of the second overlay mark 200 in the X-axis direction. In addition, the first overlay mark 100 and the second overlay mark 200 are used to measure the overlay in the X-axis direction between different pattern layers.

The third overlay structure 210 includes a plurality of third bars 212 that are formed extending in the Y-axis direction. The third bars 212 are arranged at intervals in the X-axis direction. The third overlay structure 210 is symmetric with respect to the center line (matched with the Y-axis) passing through the center of the third overlay structure 210 in the Y-axis direction. The third bars 212 are arranged such that the farther the third bars 212 are from the center line in the Y-axis direction, the narrower the intervals therebetween are.

The fourth overlay structure 220 includes a plurality of fourth bars 222 that are formed extending in the Y-axis direction. The fourth bars 222 are arranged at intervals in the X-axis direction. The fourth overlay structure 220 is symmetric with respect to the center line (matched with the Y-axis) passing through the center of the fourth overlay structure 220 in the Y-axis direction. The fourth bars 222 are arranged such that the farther the fourth bars 222 are from the center line in the Y-axis direction, the narrower the intervals therebetween are.

It is shown that the numbers of the third bars 212 and the fourth bars 222 are nine each, but may be two to eight, or 10 or more.

It is shown that the numbers of and the intervals between the third bars 212, the fourth bars 222, the first bars 112, and the second bars 122 are the same, but may be different from each other.

The third overlay mark 300 includes a fifth overlay structure 310 and a sixth overlay structure 320. The third overlay mark 300 is 180-degrees rotationally symmetric with respect to the symmetry center of the third overlay mark 300. The fifth overlay structure 310 and the sixth overlay structure 320 are positioned in a first diagonal line with the first overlay mark 100 in between. That is, in FIG. 3, the fifth overlay structure 310 is at an upper right position and the sixth overlay structure 320 is at a lower left position.

In this embodiment, the third overlay mark 300 and the first overlay mark 100 may be formed in the same pattern layer.

The fifth overlay structure 310 includes a plurality of fifth bars 312 that are formed extending in the X-axis direction. The fifth bars 312 are arranged at intervals in the Y-axis direction. The fifth overlay structure 310 is symmetric with respect to the center line 315 of the fifth overlay structure 310 in the X-axis direction. The fifth bars 312 are arranged such that the farther the fifth bars 312 are from the center line 315 in the X-axis direction, the narrower the intervals therebetween are.

The sixth overlay structure 320 includes a plurality of sixth bars 322 that are formed extending in the X-axis direction. The sixth bars 322 are arranged at intervals in the Y-axis direction. The sixth overlay structure 320 is symmetric with respect to the center line 325 of the sixth overlay structure 320 in the X-axis direction. The sixth bars are arranged such that the farther the sixth bars are from the center line 325 in the X-axis direction, the narrower the intervals therebetween are.

It is shown that the numbers of the fifth bars 312 and the sixth bars 322 are nine each, but may be two or eight, or 10 or more.

The fourth overlay mark 400 includes a seventh overlay structure 410 and an eighth overlay structure 420. The fourth overlay mark 400 is 180-degrees rotationally symmetric with respect to the symmetry center of the fourth overlay mark 400. The seventh overlay structure 410 and the eighth overlay structure 420 are positioned in a second diagonal line with the first overlay mark 100 in between. The first diagonal line and the second diagonal line intersect. In FIG. 3, the seventh overlay structure 410 is at an upper left position and the eighth overlay structure 420 is at a lower right position.

In this embodiment, the fourth overlay mark 400 and the second overlay mark 200 may be formed in the same pattern layer. The fourth overlay mark 400 is formed in a different layer from the third overlay mark 300.

In this embodiment, the seventh overlay structure 410 and the eighth overlay structure 420 are used to find the center of the fourth overlay mark 400 in the Y-axis direction. In addition, the third overlay mark 300 and the fourth overlay mark 400 are used to measure the overlay in the Y-axis direction between different pattern layers.

The seventh overlay structure 410 includes a plurality of seventh bars 412 that are formed extending in the X-axis direction. The seventh bars 412 are arranged at intervals in the Y-axis direction. The seventh overlay structure 410 is symmetric with respect to the center line 415 of the seventh overlay structure 410 in the X-axis direction. The seventh bars 412 are arranged such that the farther the seventh bars 412 are from the center line 415 in the X-axis direction, the narrower the intervals therebetween are.

The eighth overlay structure 420 includes a plurality of eighth bars 422 that are formed extending in the X-axis direction. The eighth bars 422 are arranged at intervals in the Y-axis direction. The eighth overlay structure 420 is symmetric with respect to the center line 425 of the eighth overlay structure 420 in the X-axis direction. The eighth bars 422 are arranged such that the farther the eighth bars 422 are from the center line 425 in the X-axis direction, the narrower the intervals therebetween are.

It is shown that the numbers of the seventh bars 412 and the eighth bars 422 are nine each, but may be two to eight, or 10 or more.

Hereinafter, an overlay measurement method using the overlay mark 10 shown in FIG. 3 will be described. The overlay measurement method includes obtaining an image of the overlay mark 10, and analyzing the image of the overlay mark 10. The overlay mark 10 is formed simultaneously with the formation of two consecutive pattern layers or of two patterns separately formed in one pattern layer.

The obtaining of the image of the overlay mark 10 is generally obtaining an image of the first to fourth overlay marks 100, 200, 300, and 400 together by using an overlay measuring device.

In this step, an image of the overlay mark may be obtained using the overlay measuring device that includes an inclined optical element, a lens L, and a stage S supporting a device D in which the overlay mark 10 is formed. The inclined optical element may be, for example, a beam splitter BS.

Figure 4:
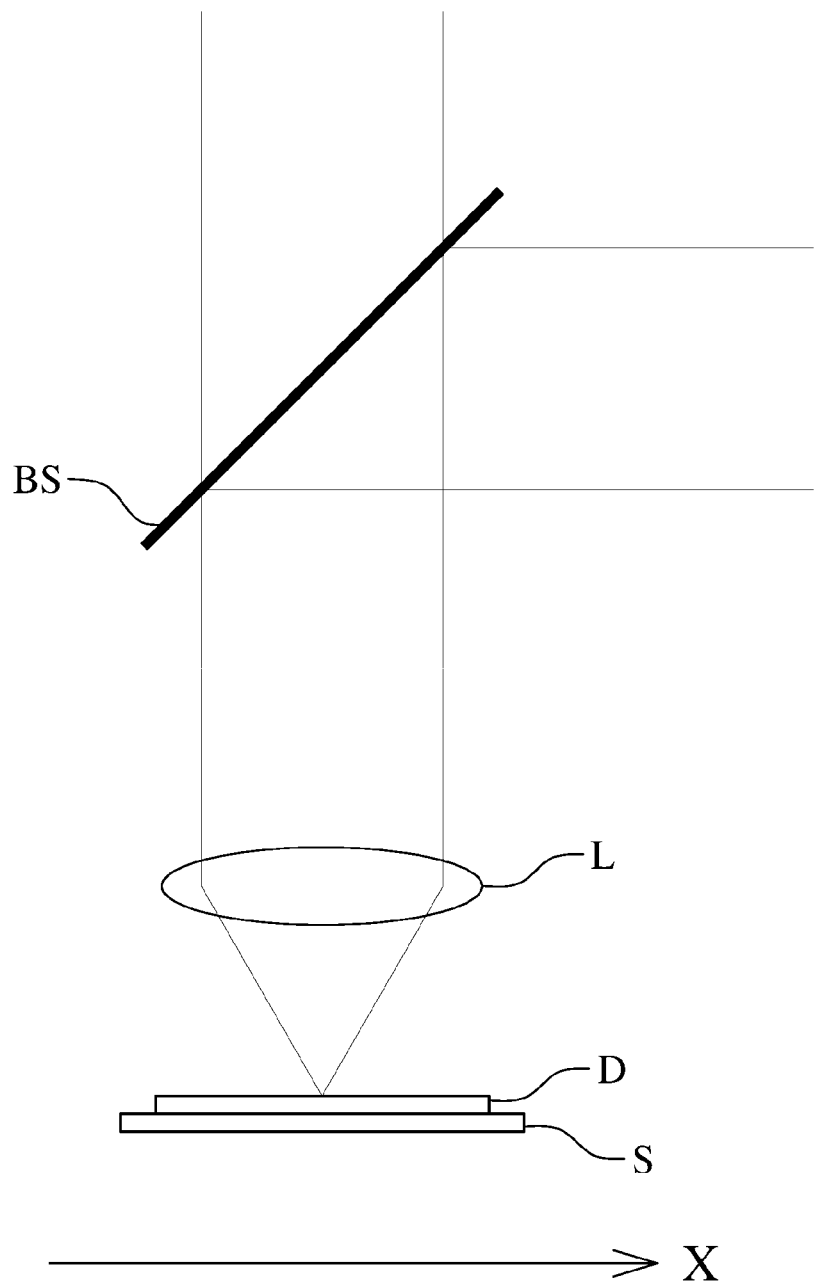
FIG. 4 is a view showing obtaining an image of an overlay mark.

FIG. 4 is a view showing a part of an example of an overlay measuring device in order to describe obtaining an image of an overlay mark. As shown in FIG. 4, it is preferable that in this step, the overlay measuring device is positioned such that the distance between the beam splitter BS, which is the inclined optical element, and the device D in which the overlay mark 10 is formed increases or decreases as it goes in the X-axis direction, the direction in which the bars 112 and 212 of the first overlay mark 100 and the second overlay mark 200 are arranged, or the distance is constant as it goes in the Y-axis direction. That is, the beam splitter BS is positioned to be inclined with respect to the X-axis.

Obtaining an image of the overlay mark with the overlay measuring device positioned as described above reduces the influence of optical aberration. This is because the bars 112, 122, 212, and 222 of the first overlay mark 100 and the second overlay mark 200 are formed only in the center portion of the overlay mark 10 with respect to the X-axis direction.

If the total area of the overlay mark 10 is equal to that of the conventional overlay mark 1 shown in FIG. 1, the distance (the width of the first overlay mark 100 and the second overlay mark 200 in the X-axis direction) between the bars positioned at the opposite ends of the first overlay mark 100 and the second overlay mark 200 in the X-axis direction is relatively short, compared to the conventional overlay mark 1.

Accordingly, the difference in distance in the Z-axis direction from each of the bars at the opposite ends to the beam splitter BS, which is the inclined optical element, is small, compared to the conventional overlay mark 1. Accordingly, the influence of optical aberration according to the difference in distance to the inclined optical element is minimized.

The bars 312, 322, 412, and 422 of the third overlay mark 300 and the fourth overlay mark 400 are formed over the entire area of the overlay mark 10 with respect to the Y-axis direction. However, the beam splitter BS, which is the inclined optical element, is not positioned to be inclined with respect to the Y-axis and has little distortion in the Y-axis direction. Therefore, the bars 312, 322, 412, and 422 of the third overlay mark 300 and the fourth overlay mark 400 are barely affected by optical aberration caused by the inclined optical element.

In the present disclosure, the bars 112, 122, 212, and 222 arranged in one direction (the X-axis direction in FIG. 3) are placed all together in the center. This is considered in obtaining the image of the overlay mark 10, and the overlay measuring device is positioned such that the beam splitter BS, which is the inclined optical element, is at an angle to the axis (the X-axis in FIGS. 3 and 4) in the direction, thereby minimizing the influence of optical aberration.

The analyzing of the image of the overlay mark 10 may include: measuring offsets of the center of the first overlay mark 100 in the X-axis direction and the center of the second overlay mark 200 in the X-axis direction, in the obtained image of the overlay mark; and measuring offsets of the center of the third overlay mark 300 in the Y-axis direction and the center of the fourth overlay mark 400 in the Y-axis direction.

The measuring of the offsets of the center of the first overlay mark 100 in the X-axis direction and the center of the second overlay mark 200 in the X-axis direction may include the following steps.

First, obtained is the difference between the X value of the center of the first overlay mark 100 and the X value of the center of the obtained image of the overlay mark in step S11.

As shown in FIG. 3, a partial area $A_1$ of the first overlay structure 110 is selected from the obtained image of the overlay mark. Next, an area $A_2$ that is 180-degrees symmetric to the area $A_1$ with respect to the center of the obtained image of the overlay mark is selected. The area $A_2$ is positioned at the second overlay structure 120.

Next, each of the 2D images of the two selected areas $A_1$ and $A_2$ is projected in one dimension. That is, all the gray values of the pixels having the same X value in the 2D image are added up, the gray values are averaged, or the gray values are normalized.

Figure 5:
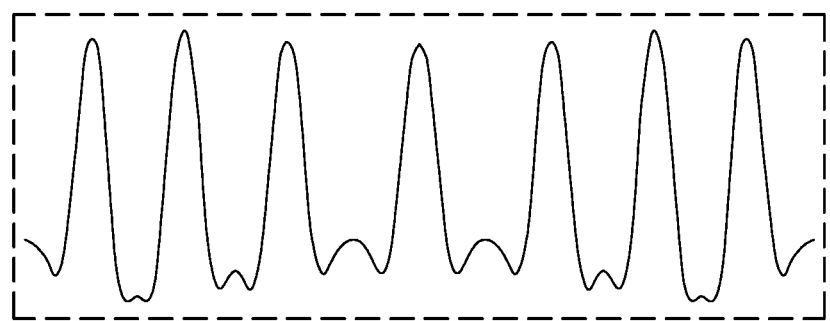
FIG. 5 is a view showing a signal obtained from the overlay mark shown in FIG. 3.

Then, as shown in FIG. 5, the graph showing a change in the gray values according to the X values is drawn. The gray values of the vertical bars are different from the gray values of the spaces between the vertical bars, so the graph shown in FIG. 5 is obtained.

Figure 2:
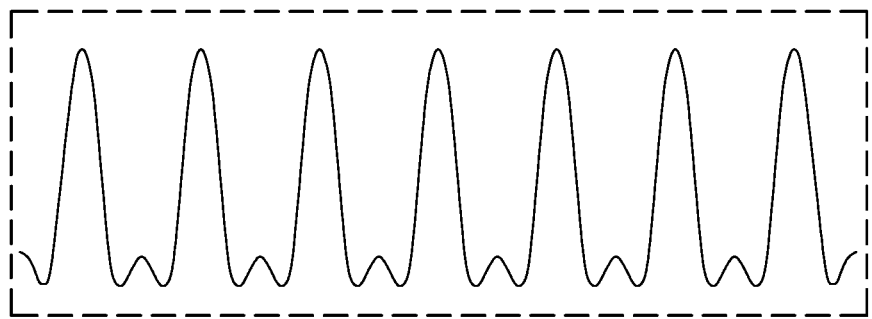
FIG. 2 is a view showing a signal obtained from one working zone of the overlay mark shown in FIG. 1.

As shown in FIG. 5, the obtained graph shows irregular intervals between the peaks. Accordingly, unlike the conventional overlay mark 1 that provides the periodic graph having regular intervals between the peaks shown in FIG. 2, even when an overlay error is equal to or greater than one period, the error is detected.

In addition, the problem in the related art that when the signal is degraded, accuracy decreases in the process of correlation analysis can be solved to some extent.

In addition, the difference (contrast) between the maximum and minimum values of the signal is not reduced even when the intervals between the bars are reduced, so the signal can be strengthened by increasing the density of the bars.

In addition, without comparing the entire graphs, the overlay can be measured by comparing individual peaks to each other.

If the X value of the center of the first overlay mark 100 is the same as the X value of the center of the obtained image of the overlay mark, the two graphs should have the same shape. If the X value of the center of the first overlay mark 100 is different from the X value of the center of the obtained image of the overlay mark, one of the graphs is offset in the X-axis direction with respect to the other graph. Herein, the offset value refers to the difference between the X value of the center of the first overlay mark 100 and the X value of the center of the obtained image of the overlay mark.

Next, in the same way, obtained is the difference between the X value of the center of the second overlay mark 200 and the X value of the center of the obtained image of the overlay mark in step S12.

Next, using the obtained difference between the X value of the center of the first overlay mark 100 and the X value of the center of the obtained image of the overlay mark and the obtained difference between the X value of the center of the second overlay mark 200 and the X value of the center of the obtained image of the overlay mark, an overlay value in the X-axis direction is obtained in step S13.

Next, in the same way, obtained is the difference between the Y value of the center of the third overlay mark 300 and the Y value of the center of the obtained image of the overlay mark in step S14. Next, obtained is the difference between the Y value of the center of the fourth overlay mark 400 and the Y value of the center of the obtained image of the overlay mark in step S15.

Next, using the obtained difference between the Y value of the center of the third overlay mark 300 and the Y value of the center of the obtained image of the overlay mark and the obtained difference between the Y value of the center of the fourth overlay mark 400 and the Y value of the center of the obtained image of the overlay mark, an overlay value in the Y-axis direction is obtained in step S16.

Hereinafter, a method of manufacturing a semiconductor device by using the overlay mark 10 shown in FIG. 3 will be described. The method of manufacturing the semiconductor device by using the overlay mark 10 starts with forming the overlay mark 10. The overlay mark 10 is formed simultaneously with the formation of two consecutive pattern layers or of two patterns separately formed in one pattern layer.

The forming of the overlay mark 10 may be forming the overlay mark 10 by using a scanner-type stepper. Herein, it is preferable that the scanning direction of the stepper is parallel to the longitudinal direction (the Y-axis direction in FIG. 3) of the bars 112, 122, 212, and 222 of the first overlay mark 100 and the second overlay mark 200 positioned in the center. Because constant velocity control is achieved in the scanning direction of the stepper, the distortion of the bars 112, 122, 212, and 222 in the Y-axis direction is little, but distortion may occur in the X-axis direction. Therefore, it is preferable that the bars 112, 122, 212, and 222 arranged in the X-axis direction perpendicular to the scanning direction are arranged in the center so as to minimize distortion.

Next, an overlay value is measured using the overlay mark 10. The measuring of the overlay value is the same as the above-described overlay measurement method.

Finally, the measured overlay value is used in process control for forming two consecutive pattern layers or two patterns separately formed in one pattern layer. That is, the derived overlay is used for process control so that the consecutive pattern layers or the two patterns are formed at determined positions.

Figure 6:
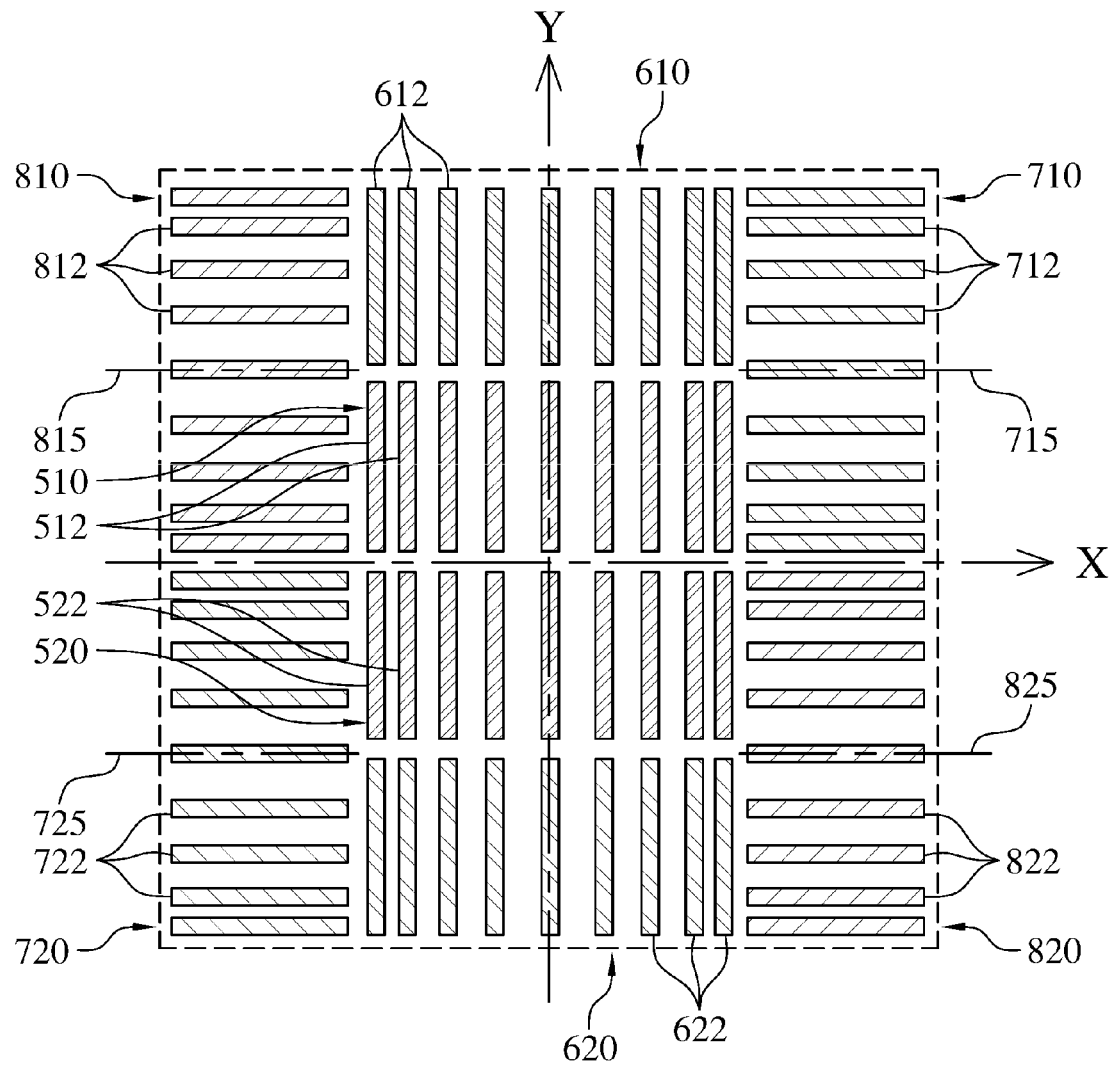
FIGS. 6 and 7are plan views showing examples of an overlay mark according to the present disclosure.

FIGS. 6 and 7are plan views showing examples of an overlay mark according to the present disclosure.

An overlay mark 20 shown in FIG. 6 includes a first to fourth overlay marks 500, 600, 700, and 800. The first overlay mark 500 includes a first overlay structure 510 and a second overlay structure 520 positioned in the center. The second overlay mark 600 includes a third overlay structure 610 and a fourth overlay structure 620 positioned above and below the first overlay mark 500. The third overlay mark 700 includes a fifth overlay structure 710 and a sixth overlay structure 720 positioned in a diagonal line with the first overlay mark 500 in between. Last, the fourth overlay mark 800 includes a seventh overlay structure 810 and an eighth overlay structure 820 positioned in a diagonal line with the first overlay mark 500 in between.

The overlay mark 20 is different from the example shown in FIG. 3 because the farther the bars 512, 522, 612, and 622 arranged in the X-axis direction are from the center line in the Y-axis direction, the narrower the intervals between the adjacent bars 512, 522, 612, and 622 are. In addition, the farther the bars 712, 722, 812, and 822 arranged in the Y-axis direction are from the respective center lines 715, 725, 815, and 825 in the X-axis direction, the narrower the intervals between the adjacent bars 712, 722, 812, and 822 are. In addition, the overlay mark 20 is different from the example shown in FIG. 3 because the first bars 712 and the second bars 722 are separated. The first bars 712 and the second bars 722 may be connected to each other as in the example shown in FIG. 3.

Figure 7:
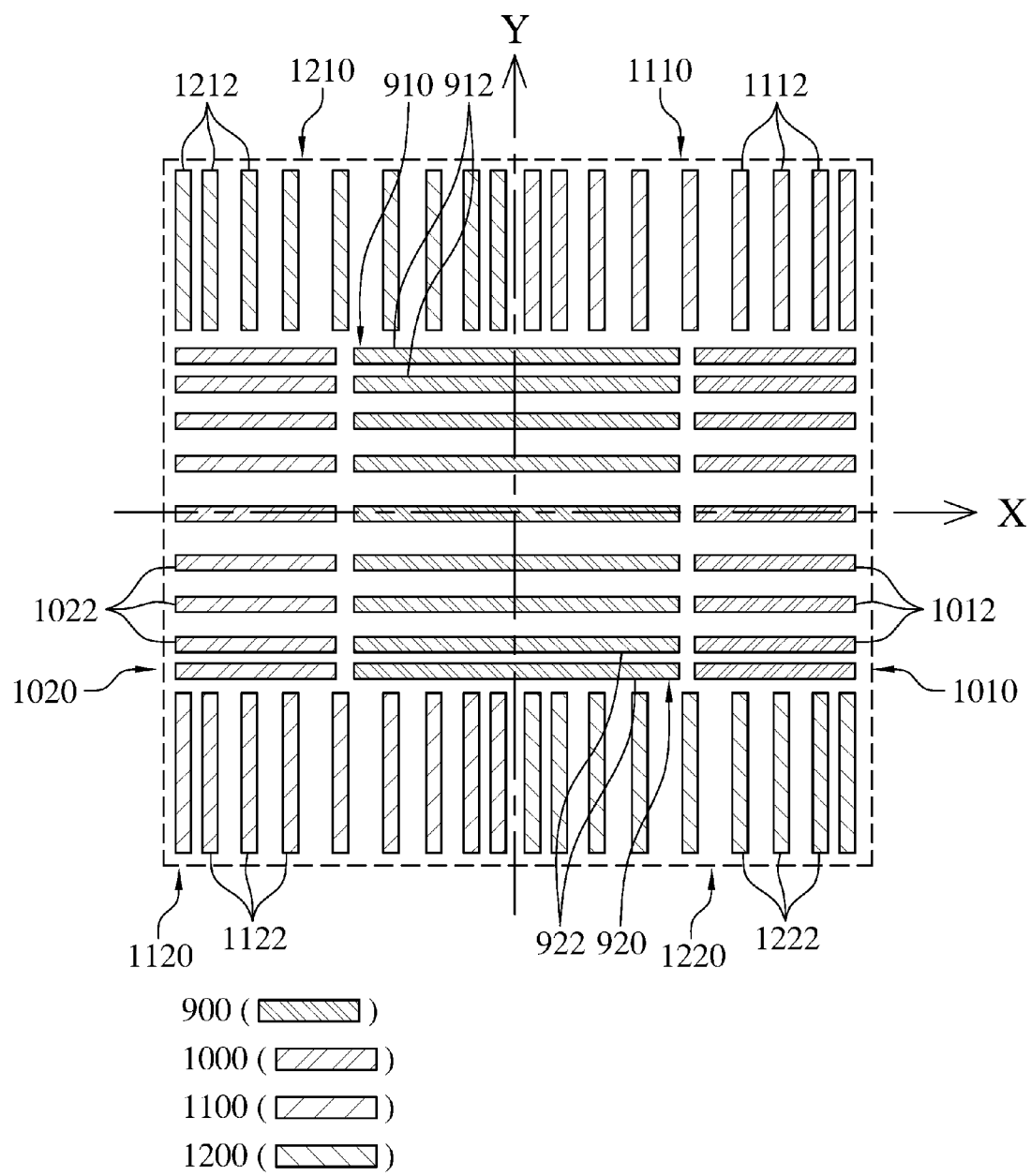

An overlay mark 30 shown in FIG. 7 includes a first to fourth overlay marks 900, 1000, 1100, and 1200. The first overlay mark 900 includes a first overlay structure 910 and a second overlay structure 920 positioned in the center. The second overlay mark 1000 includes a third overlay structure 1010 and a fourth overlay structure 1020 positioned on the left and the right of the first overlay mark 900. The third overlay mark 1100 includes a fifth overlay structure 1110 and a sixth overlay structure 1120 positioned in a diagonal line with the first overlay mark 500 in between. Last, the fourth overlay mark 1200 includes a seventh overlay structure 1210 and an eighth overlay structure 1220 positioned in a diagonal line with the first overlay mark 500 in between.

Unlike the example shown in FIG. 3, in the overlay mark 30 shown in FIG. 7, a first direction is the Y-axis direction and a second direction is the X-axis direction. This embodiment may be used when the scanning direction of the stepper is the Y-axis direction. In the case of using the overlay mark 30 of this embodiment, it is preferable that in obtaining an image of the overlay mark 30, the overlay measuring device is positioned such that the inclined optical element is inclined to the Y-axis direction.

The embodiments described above are merely exemplary embodiments of the present disclosure, and the scope of the present disclosure is not limited to the above-described embodiments. Various changes, modifications, or substitutions may be made by those skilled in the art without departing from the technical idea of the present disclosure and claims. It should be understood that such embodiments fall within the scope of the present disclosure.

What is claimed is:

1. An overlay mark for determining relative misalignment between two or more pattern layers or between two or more patterns separately formed in one pattern layer, the overlay mark comprising:
    a first overlay mark positioned in a center portion of the overlay mark, and comprising a first overlay structure and a second overlay structure, wherein the first overlay structure comprises a plurality of first bars arranged at intervals in a first direction, and the second overlay structure comprises a plurality of second bars arranged at intervals in the first direction, and is 180-degrees rotationally symmetric to the first overlay structure;
    a second overlay mark comprising a third overlay structure and a fourth overlay structure, wherein the third overlay structure is offset from the first overlay structure in a second direction perpendicular to the first direction, and comprises a plurality of third bars arranged at intervals in the first direction, and the fourth overlay structure comprises a plurality of fourth bars arranged at intervals in the first direction, is positioned to face the third overlay structure with the first overlay mark in between, and is 180-degrees rotationally symmetric to the third overlay structure;
    a third overlay mark comprising a fifth overlay structure and a sixth overlay structure positioned in a first diagonal line with the first overlay mark in between, wherein the fifth overlay structure and the sixth overlay structure are 180-degrees rotationally symmetric to each other, the fifth overlay structure comprises a plurality of fifth bars arranged at intervals in the second direction, and the sixth overlay structure comprises a plurality of sixth bars arranged at intervals in the second direction; and
    a fourth overlay mark comprising a seventh overlay structure and an eighth overlay structure positioned in a second diagonal line intersecting the first diagonal line with the first overlay mark in between, wherein the seventh overlay structure and the eighth overlay structure are 180-degrees rotationally symmetric to each other, the seventh overlay structure comprises a plurality of seventh bars arranged at intervals in the second direction, and the eighth overlay structure comprises a plurality of eighth bars arranged at intervals in the second direction.

2. The overlay mark of claim 1, wherein the first overlay structure is symmetric with respect to a center line in the second direction, and the intervals between the first bars adjacent to each other are different from each other.

3. The overlay mark of claim 2, wherein the farther the first bars are from the center line in the second direction, the narrower the intervals between the first bars adjacent to each other are.

4. The overlay mark of claim 2, wherein the farther the first bars are from the center line in the second direction, the broader the intervals between the first bars adjacent to each other are.

5. The overlay mark of claim 1, wherein the first bars and the second bars are connected to each other in the second direction.

6. The overlay mark of claim 1, wherein the overlay mark is formed using a scanner-type stepper, and
the second direction is parallel to a scanning direction of the stepper.

7. A method of manufacturing a semiconductor device, the method comprising:
forming an overlay mark simultaneously with formation of a plurality of consecutive pattern layers or a plurality of patterns separately formed in one pattern layer;
measuring an overlay value by using the overlay mark; and
using the measured overlay value to control a process of forming the plurality of consecutive pattern layers or the plurality of patterns separately formed in one pattern layer,
wherein the overlay mark is the overlay mark according to claim 1.

8. The method of claim 7, wherein in the forming of the overlay mark, the overlay mark is formed using a scanner-type stepper, and
the second direction is parallel to a scanning direction of the stepper.

9. A method of measuring an overlay between a plurality of consecutive pattern layers or a plurality of patterns separately formed in one pattern layer, the method comprising:
obtaining an image of an overlay mark that is formed simultaneously with formation of the plurality of consecutive pattern layers or the plurality of patterns separately formed in the one pattern layer; and
analyzing the image of the overlay mark,
wherein the overlay mark is the overlay mark according to claim 1.

10. The method of claim 9, wherein in the obtaining of the image of the overlay mark, the image of the overlay mark is obtained using an overlay measuring device provided with an inclined optical element, and
in the obtaining of the image of the overlay mark, the overlay measuring device is positioned such that a distance between the inclined optical element and the overlay mark increases or decreases as the distance goes in the first direction, and the distance is constant as the distance goes in the second direction.

11. The method of claim 10, wherein the inclined optical element is a beam splitter.

* * * * *